United States Patent [19]

Nakano et al.

[11] Patent Number: 4,595,745
[45] Date of Patent: Jun. 17, 1986

[54] ORGANIC SOLVENT-SOLUBLE PHOTOSENSITIVE POLYAMIDE RESIN

[75] Inventors: Tsunetomo Nakano; Hiroshi Yasuno; Kazuaki Nishio, all of Ichihara, Japan

[73] Assignee: UBE Industries, Ltd., Yamaguchi, Japan

[21] Appl. No.: 622,859

[22] Filed: Jun. 21, 1984

[30] Foreign Application Priority Data

Jun. 27, 1983 [JP] Japan .............................. 58-115432
Dec. 12, 1983 [JP] Japan .............................. 58-234026

[51] Int. Cl.$^4$ ...................... C08G 69/26; C08G 69/40
[52] U.S. Cl. .................................... 528/125; 528/126; 528/128; 528/183; 528/184; 528/186; 528/220; 528/229; 528/338; 528/340; 528/342; 528/345; 528/348; 430/283; 430/287
[58] Field of Search ............... 528/338, 340, 342, 345, 528/348, 183, 184, 186, 125, 126, 128, 220, 229; 430/283

[56] References Cited

U.S. PATENT DOCUMENTS 4,397,999 8/1983 Ahne et al. ........................ 528/345

Primary Examiner—Lester L. Lee
Attorney, Agent, or Firm—Burgess, Ryan & Wayne

[57] ABSTRACT

An organic solvent-soluble photosensitive polyamide resin usable for producing photoset resin product having excellent heat resistance and electrical and mechanical properties, comprising a polycondensation product of an aromatic dicarboxylic acid component with an aromatic diamine component consisting of 10 to 100 molar % of a photosensitive diamine compound of the formula (I) and 10 to 90 molar % of a non-photosensitive diamine compound of the formula (II),

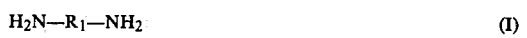

$$H_2N-R_1-NH_2 \qquad (I)$$

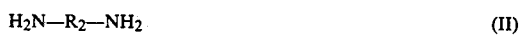

$$H_2N-R_2-NH_2 \qquad (II)$$

wherein $R_1$ represents an aromatic divalent residue having a photosensitive radical and $R_2$ represents an armoatic divalent residue having no photosensitive radical.

10 Claims, No Drawings

ORGANIC SOLVENT-SOLUBLE PHOTOSENSITIVE POLYAMIDE RESIN

BACKGROUND OF THE INVENTION

1. Field of the Invention

The present invention relates to an organic solvent-soluble photosensitive polyamide resin. More particularly, the present invention relates to an aromatic polyamide resin having photosensitive radicals and exhibiting satisfactory solubility in certain types of organic solvents and useful for producing a photoset resin product having excellent heat resistance and electrical and mechanical properties.

The organic solvent-soluble photosensitive polyamide resin of the present invention is useful in the semiconductor field as a material for forming insulating films and passivation films for solid-state elements and as an interlaminar insulating material for semiconductor integrated circuits and multilayer printed circuit boards.

2. Description of the Prior Art

In the semiconductor industry, materials for forming insulating films and passivation films for solid-state elements and interlaminar insulating materials for semiconductor integrated circuits and multilayer printed circuit boards must exhibit excellent heat resistance and electrical insulating properties.

Japanese Unexamined Patent Publication (Kokai) Nos. 48-89004, 49-74739 and 56-93704, for example, disclose photosensitive polyamide resins produced by mixing a polyamide resin having no photosensitive radical with a photo-polymerizable unsaturated monomeric compound and, therefore, exhibiting an unsatisfactory photosensitivity.

Japanese Unexamined Patent Publication (Kokai) Nos. 50-8605 and 56-122833 discloses polyamides having photosensitive radicals. These polyamides are aliphatic and, therefore, exhibit unsatisfactory photosensitivity and heat resistance.

There are various approaches for producing passivation films from specific polymer resins having a high insulating property and an excellent heat resistance. Among those various polymers, for example, heat resistant polyimide resins are unsatisfactory in solubility in organic solvents and in photosensitivity. Other polymers, which are soluble in organic solvents and have photosensitive radicals, are produced by amidizing or esterifying carboxyl radicals of a polyamic acid which is a precursor of the corresponding polyimide or polyamideamic acid which is a precursor of the corresponding polyamideimide, and by introducing photosensitive radicals into the amidized or esterified polymer. These photosensitive polymers exhibit a poor stability for storage. Therefore, the precursor polymers having photosensitive radicals must be imidized or amideimidized while or after the precursor polymers are photoset, by means of baking at an elevated temperature. This causes the photoset polyimide or polyamideimide-producing process to be complicated and costly.

In order to cure a photosetting polymer or composition as described above by irradiation, it is necessary to incorporate a photo-polymerization initiator or a sensitizer in an organic solvent solution of this photosetting polymer or composition. Therefore, when the organic solvent is evaporated after coating of the organic solvent solution, such trouble as bleeding of the photopolymerization initiator or sensitizer is caused.

SUMMARY OF THE INVENTION

An object of the present invention is to provide an organic solvent-soluble photosensitive polyamide resin which is useful for producing a relief-patterned material having excellent heat resistance and electrical and mechanical properties.

The above-mentioned object can be attained by the organic solvent-soluble photosensitive polyamide resin of the present invention, which comprises a polycondensation product of an aromatic dicarboxylic acid component consisting of at least on member selected from the group consisting of aromatic dicarboxylic acids and acid halides thereof with an aromatic diamine component consisting of 10 to 100 molar % of at least one aromatic diamine compound of the formula (I):

$$H_2N-R_1-NH_2 \qquad (I)$$

and 0 to 90 molar % of at least one aromatic diamine compound of the formula (II):

$$H_2N-R_2-NH_2 \qquad (II)$$

in which formulae (I) and (II) $R_1$ represents an aromatic divalent residue having a photosensitive radical and $R_2$ represents an aromatic divalent residue having no photosensitive radical.

DESCRIPTION OF THE PREFERRED EMBODIMENTS

In the organic solvent-soluble photosensitive polyamide resin of the present invention, it is important that the aromatic diamine component to be reacted with the aromatic dicarboxylic acid component consist of 10 to 100 molar %, preferably, 60 to 100 molar %, of at least one aromatic diamine compound of the formula (I) and 0 to 90 molar %, preferably 0 to 40 molar %, of at least one aromatic diamine compound of the formula (II):

$$H_2N-R_1NH_2 \qquad (I)$$

and $$H_2N-R_2NH_2 \qquad (II)$$

$R_1$ represents an aromatic divalent residue having a photosensitive radical and $R_2$ represents an aromatic divalent residue free from photosensitive radical.

Therefore, the polyamide resin of the present invention has a backbone chain structure containing a number of photosensitive radicals derived from the aromatic diamine compound of the formula I, and therefore, exhibits an enhanced photosetting property. The polyamide resin of the present invention also exhibits a satisfactory photo-transmitting property and an excellent photo-cross linking property. Futhermore, the polyamide resin exhibits a satisfactory solubility in organic solvents. Therefore, the polyamide resin of the present invention is highly useful for producing relief-patterned material without using photosetting material which is necessary for conventional non-photosensitive polymers.

In the case of the polyamide of the present invention having photosensitizing radicals in the polymer chain, a photo-polymerization initiator or sensitizer need not be added at the photosetting step. Accordingly, the polyamide of the present invention does not suffer from the trouble caused by incorporation of the photo-polymerization initiator or sensitizer at the step of forming a relief pattern, that is, bleeding of the photo-polymerization initiator or sensitizer caused when an organic solvent is evaporated from an organic solvent solution of a photosensitive polyamide coated on a substrate. Hence, the photosensitive radicals effectively enable high sensitivity and high resolving power. Moreover, since there is no need to use a sensitizer having a low molecular weight, the heat weight loss of the polymer can be minimized.

When the content of the photosensitive aromatic diamine compound of the formula (I) in the aromatic diamine component is less than 10 molar %, the resultant polyamide resin has a reduced content of photosensitive radicals and exhibits an unsatisfactory photosetting property.

The non-photosensitive diamine compound of the formula (II) is effective for improving the thermal properties of the resultant polyamide resin. However, the content of the non-photosensitive compound of the formula (II) in the aromatic diamine component should be 90 molar % or less. A content of more than 90 molar % results in a poor photosetting property of the resultant polyamide resin.

The organic solvent-soluble photosensitive polyamide resin of the present invention is prepared by polymerizing an aromatic dicarboxylic acid component with an aromatic diamine component consisting of at least one photosensitive aromatic diamine compound of the formula (I) alone or by copolymerizing an aromatic dicarboxylic acid component with an aromatic diamine component consisting of 10 molar % or more preferably 60 molar % or more, of at least one photosensitive diamine compound of the formula (I) 90 molar % or less preferably 40 molar % or less, of at least one non-photosensitive diamine compound of the formula (II). The polymerization or copolymerization is carried out in an organic solvent preferably, at a relatively low temperature, for example, 100° C. or less, more preferably 80° C. or less, for 0.1 to 48 hours.

The aromatic dicarboxylic component and the aromatic diamine component are usually used in approximately equimolar amounts.

In the aromatic dicarboxylic component, the aromatic dicarboxylic acid is selected from the group consisting of terephthalic acid, isophthalic acid, 4,4'-dicarboxybiphenyl, 4,4'-dicarboxy-diphenylmethane and 4,4'-dicarboxy-biphenylether. The above-mentioned dicarboxylic acids are preferably in the form of acid halides, more preferably, acid chlorides.

The aromatic diamine compound of the formula (I) is preferably selected from aromatic diamine compounds of the formulae (III), (IV) and (V):

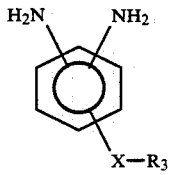
(III)

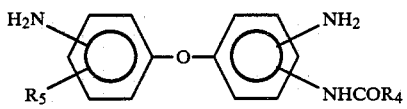
(IV)

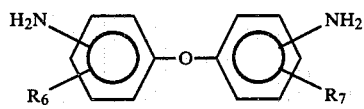
(V)

in which formulae (III), (IV) and (V) X represents a divalent radical selected from the group consisting of —CO—O— and —CH$_2$O—, R$_3$ and R$_4$ respectively represent, independently from each other, an organic residue having an ethylenically unsaturated radical, and R$_5$ represents a member selected from the group consisting of a hydrogen atom and radicals of the formula —HNCOR$_4$, wherein R$_4$ is the same as defined above, R$_6$ represents a member selected from the group consisting of a hydrogen atom and alkyl radical having 1 to 5 carbon atom and R$_7$ represents a member selected from the group consisting of

CH$_2$=CH—COOCH$_2$CH$_2$OOC— and

CH$_2$=(CH$_3$)—COOCH$_2$CH$_2$OOC—;

and diaminochalcone compounds.

In the formula (III), the organic residue represented by R$_3$ has a photosensitive radical such as a photosensitive unsaturated hydrocarbon radical, for example, selected from the group consisting of those of the formulae:

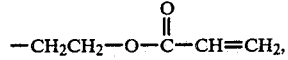

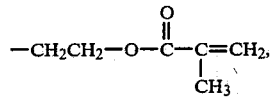

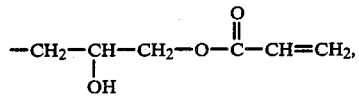

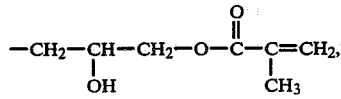

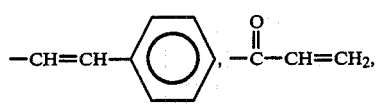

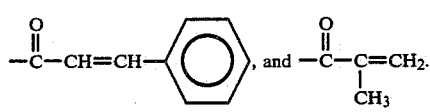

The aromatic diamine compound of the formula (III) is preferably selected from the group consisting of diaminobenzoic acid esters, for example, 3,5-diaminobenzoic acid ethyleneglycol monoacrylate ester, 3,5-diaminobenzoic acid ethyleneglycol monomethacrylate ester, 3,5-diaminobenzoic acid glycidyl acrylate ester, 3,5-diaminobenzoic acid glycidyl methacrylate ester, 3,5-diaminobenzoic acid cinnamic acid ester, 2,4-diaminobenzoic acid ethyleneglycol monoacrylate ester, 2,4-diaminobenzoic acid ethyleneglycol monomethacrylate ester, 2,4-diaminobenzoic acid glycidyl acrylate ester, 2,4-diaminobenzoic acid glycidyl methacrylate ester and 2,4-diaminobenzoic acid cinnamic acid ester; and diaminobenzyl acrylate compounds, for example, 3,5-diaminobenzyl acrylate, and 3,5-diaminobenzyl methacrylate.

In the formula (IV), the organic residue represented by $R_4$ is preferably selected from the group consisting of those of the formulae —CH=CH$_2$ and

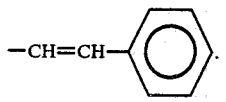

The diaminodiphenylether compound of the formula (IV) is preferably selected from the group consisting of 4-acrylamido-3,4'-diaminodiphenylether, 2-acrylamido-3,4'-diaminodiphenylether, 4-cinnamamido-3,4'-diaminodiphenylether, 3,4'-diacrylamido-3,4-diaminodiphenylether, and 3,4'-dicinnamamido-3',4-diaminodiphenylether.

The aromatic diamine compound of the formula (V) may be selected from 4-methyl-2'-carboxyethyl methacrylate-3,4'-diaminodiphenylether and 4-methyl-2'-carboxyethylacrylate-3,4'-diamino-diphenylether. The above-mentioned 4-methyl-2'-carboxyethyl acrylate (or methacrylate)-3,4'-diaminodiphenylether is an ester of 4-methyl-3,4'-diaminodiphenyl-2'-carboxylic acid with ethyleneglycol monoacrylate (or methacrylate).

The diaminochalcone compound may be selected from the group consisting of, for example, 4,4'-diaminochalcone, 3,3'-diaminochalcone, 3,4'-diaminochalcone, 3',4-diaminochalcone, 4'-methyl- 3',4-diaminochalcone, 4'-methoxy-3',4-diaminochalcone and 3'-methyl-3,5-diaminochalcone.

The diamine compounds of the formulae (III) and (IV) are novel compounds. Although they may be produced by any method, they are preferably prepared by the following methods.

(1) Preparation of diaminodiphenylether compound of the formula (IV)

A mono- (or di-) aminodinitrophenylether which has been prepared by the hydrolysis of the corresponding mono (or di) acetylamido-dinitrophenylether, is reacted with an ethylenically unsaturated alphatic acid halide, for example, acrylic acid chloride. The resultant reaction product is reduced to provide a corresponding diaminodiphenylether compound of the formula (IV).

(2) Preparation of diaminobenzoic acid ester

A dinitrobenzoic acid chloride is reacted with an ethylenically unsaturated aliphatic acid hydroxyalkylester, for example, hydroxyethyl methacrylate, and the resultant reaction product is reduced.

(3) Preparation of diaminobenzyl acrylate compound

A dinitrobenzyl alcohol is reacted with an ethylenically unsaturated aliphalic acid chloride, for example, acrylic acid chloride, and the resultant reaction product is reduced.

The non-photosensitive aromatic diamine compound of the formula (II) is selected from, preferably, the group consisting of p-phenylenediamine, m-phenylenediamine, 2,4-diaminotoluene, 4,4'-diaminodiphenylether, 4,4-diaminodiphenylmethane, o-toluidine, 1,4-bis(4-aminophenoxy)benzene, 2,2-bis(4-aminophenoxyphenyl)propane and o-toluidinesulfone.

The non-photosensitive aromatic diamine compound of the formula (II) may also be that which has as $R_2$ a ketone group-containing organic residue. As the ketone group-containing organic residue, there can be mentioned the following residues:

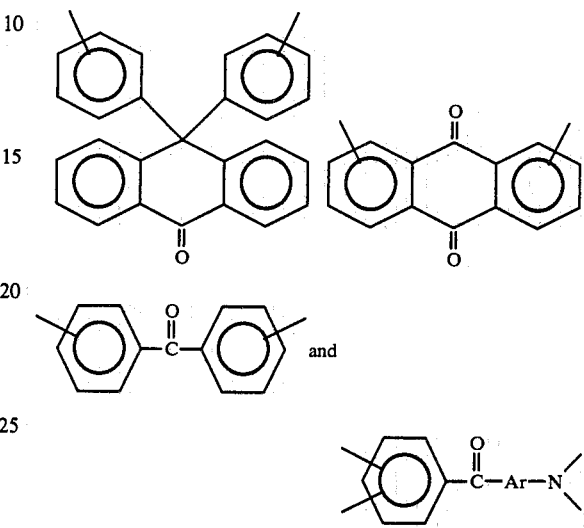

wherein Ar represents an aromatic ring and R represents a methyl or ethyl group.

As the non-photosensitive aromatic diamine compounds represented by the formula (II), which have as $R_2$ a ketone group-containing organic residue, there can be mentioned 9,9-bis(4-aminophenyl)-10-anthrone, 1,5-diaminoanthraquinone, 1,4-diaminoanthraquinone, 3,3'-diaminobenzophenone, 4'-N,N-dimethylamino-3,5-diaminobenzophenone and 1-dimethylamino-4-(3,5-diaminobenzoyl)naphthalene, though compounds used in the present invention are not limited to the compounds exemplified above.

It is preferable that the non-photosensitive aromatic diamine compound be used in an amount of not more than 40 molar %, more preferably not more than 20 molar %, based on the total amount of the aromatic diamine component.

Of the non-photosensitive aromatic diamine compounds of the formula (II) used in the present invention, the compound in which the organic residue $R_2$ is

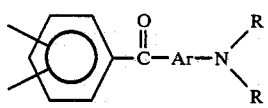

is a novel compound. The process for the synthesis of this compound is not particularly critical, but there is preferably adopted a process in which dinitrobenzoyl chloride is reacted with aniline to form dinitrobenzanilide; the thus-formed dinitrobenzanilide is reacted with

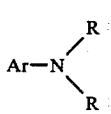

(in which Ar and R are as defined above) and phosphorus oxychloride; the thus-obtained reaction product is mixed with concentrated hydrochloric acid to form

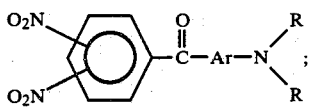

and then this compound is reduced to obtain the intended diamine compound.

The above-mentioned polymerization or copolymerization reaction of the acid and diamine components is carried out in an organic solvent consisting of, for example, at least one member selected from N,N-dimethylsulfoxide, N,N-dimethylformamide, N,N-diethylacetamide N-methyl-2-pyrrolidone, and hexamethylene phosphamide.

The photosensitive polyamide resin of the present invention preferably has a logarithmic viscosity of from 0.1 to 3.0, more preferably from 0.5 to 2.0, determined in a concentration of 0.5 g per 100 ml of N-methyl-2-pyrrolidone at a temperature of 30° C.

The organic solvent-soluble photosensitive polyamide resin of the present invention is useful as a photosensitive material for forming a relief-patterned material. The photosensitive material is prepared, for example, from a solution of the polyamide resin dissolved preferably in a concentration of from 5% to 30% in an organic solvent consisting of, for example, at least one member selected from N,N-dimethylformamide, N,N-dimethylacetamide, N- methyl-2-pyrrolidone, dimethylsulfoxide, and hexamethylenephosphamide.

Since the photosensitive polyamide of the present invention has photosensitive radicals in the polymer chain and shows a sensitizing effect, a sensitizer or a photo-polymerization initiator need not be added to a solution of the photosensitive polyamide. However, a sensitizer or photo-polymerization initiator may be added according to need. The sensitizing effect can be increased by adding a sensitizing assistant such as ethyl N,N-dimethylaminobenzoate or methyl N,N-dimethylaminoanthranilate.

The sensitizing agents and photopolymerization initiators preferably include Michler's ketone (N,N'-tetramethyl-4,4'-diaminobenzophenone), benzoin, benzoinmethylether, benzoinisopropylether, 2-tertbutylanthraquinone, 1,2-benzo-9,10-anthraquinone, 4,4'-bis (diethylamino), benzophenone, acetophenone, benzophenone, thioxanthone, and 1,5-acenaphthene, and are used in an amount of from 0.1 to 10 parts by weight per 100 parts by weight of the photosensitive polyamide resin.

The photopolymerizable compounds having an ethylenically unsaturated radical preferably include ethyleneglycol diacrylate and dimethacrylate, propyleneglycol diacrylate and dimethacrylate, trimethylolpropane triacrylate and trimethacrylate, tetramethylolmethane tetracrylate and tetramethacrylate, N,N'-methylene bis-acrylate and bis-methacrylate, diethylaminoethyl acrylate and methacrylate, 1.3,5,-triacryloylhexahydro-s-triazine, and tris (hydroxyethylacryloyl) isocyanurate.

The photosensitive polyamide resin of the present invention can be used to prepare a relief-patterned material in the following manner.

The photosensitive polyamide resin is dissolved in a desired concentration together with necessary additives in an organic solvent. The resultant solution is spread on a substrate and the solution layer is dried by evaporating away the solvent. The solution-spreading operation can be carried out by means of any coating device, for example, a rotary coating machine. The drying operation is carried out ususally at a temperature of 150° C. or less, preferably 100° C. or less. The drying operation may or may not be carried out under reduced pressure. After the drying operation is completed, a negative photomask chart having a desired pattern is placed on the resultant photosensitive polyamide resin layer surface, and actinic rays, for example, ultraviolet rays, visible light, electron beams, or X-rays, are irradiated to the photosensitive polyamide resin layer through the photomask chart. Then, non-exposed, non-photoset portions of the photosensitive polyamide resin layer are removed by treatment with a developing solution. The developing solution consists of a solvent consisting of at least one member selected from, for example, N,N-dimethylformamide, N,N-dimethylacetamide, dimethylsulfoxide, N-methyl-2-pyrrolidone, and hexamethylene phosphamide, or a mixture of the above-mentioned solvent with methyl alcohol and/or ethyl alcohol.

The polyamide resin of the present invention has excellent photosetting property (photo-cross-linking property), superior solubility in organic solvents and transparency and, therefore, is useful as a photosensitive material which can easily form a desired relief pattern by means of a photochemical reaction, without using additional photosetting material. Also, the polyamide resin of the present invention can be directly photo-set with no addition step necessary for the photoset resin. A usual photosensitive material made from a photosensitive polyamic acid resin or polyamideamic acid resin needs an imidization step for the polymeric acid resin after an image-forming photo-setting step for the photosensitive material is completed. Accordingly, the photosensitive material made from the photosensitive polyamide resin of the present invention is highly advantageous not only in that the image-forming operation can be carried out in a simplified easy process but also in that the resultant product exhibits an excellent heat stability and dimensional stability at an elevated temperature.

When the photosensitive polyamide resin of the present invention is photoset, the resultant product exhibits an excellent heat resistance, an insolubility in the organic solvents for the photosensitive polyimide resin and superior electrical and mechanical properties.

The relief-patterned material made from photosensitive polyamide resin of the present invention exhibits excellent heat resistance and electrical and mechanical properties and is useful not only as an insulating film and a passivation film for solid-state elements in semiconductor devices but also as an insulating film and a solder resist for multilayer circuit structure, for example, hybrid circuits and printed circuits.

Furthermore, since the photosensitive polyamide resin of the present invention exhibits excellent photocrosslinking property and transparency, a thick film having a thickness of several dozen μm can be made therefrom. Accordingly, the photosensitive polyamide resin is useful for the preparation of a relief pattern for letterpress printing, or the preparation of such a relief pattern together with an insulation film layer.

The present invention will be further explained by means of the following synthesis examples and other examples.

SYNTHESIS EXAMPLE 1

Preparation of 3,5-diaminobenzoic acid ethyleneglycol monomethacrylate ester

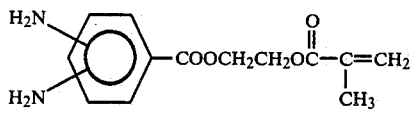

First Step (Synthesis of 3,5-dinitrobenzoic acid ethyleneglycol monomethacrylate ester)

A solution of 29.6 g of 2-hydroxyethyl methacrylate and 18.1 g of pyridine dissolved in 200 ml of tetrahydrofuran (THF) was added dropwise with a solution of 50 g of 3,5-dinitrobenzoic acid chloride at a temperature of 5° C. to 6° C. over a period of one hour by means of a dropping funnel. The resultant reaction mixture was stirred at a temperature of from 10° C. to 15° C. for one hour. The resultant hydrochloric acid pyridine salt deposited from the reaction mixture was separated by means of a Buchner funnel filter. The residual filtrate was concentrated and then was poured into water so as to form white-yellow precipitate.

The precipitate was washed several times by means of decantation and then dried under vacuum. 3,5-dinitrobenzoic acid ethyleneglycol monomethacrylate ester was obtained in an amount of 60 g.

Second Step (Reduction of 3,5-dinitrobenzoic acid ethyleneglycol monomethacrylate ester)

A solution of 5 g of the 3,5-dinitrobenzoic acid ethyleneglycol monomethacrylate ester obtained in the first step in 36 ml of acetic acid was added intermittently in amounts of from 2 to 4 ml each time to suspension of 27 g of iron powder in a mixture of 15 ml of water and 35 ml of acetic acid at a temperature of 25°±3° C. within a period of about 20 minutes while the resultant reaction mixture was stirred. Thereafter, the reaction mixture was additionally stirred for 10 minutes.

The reaction mixture was filtered by using a Buchner funnel to remove the excessive amount of the iron powder. The residual filtrate was cooled to a temperature of about 0° C. by adding pieces of ice. Thereafter, the pH of the filtrate was adjusted to about 8.0 by an aqueous ammonia solution. The filtrate was then subjected to an extraction procedure with ethyl acetate. The resultant ethyl acetate extract solution was washed with water and dried and then ethyl acetate was eliminated from the extract solution by means of evaporation at a temperature of 35° C. under a reduced pressure of about 20 mmHg.

The resultant crude product was obtained in an amount of 11.2 g (yield of 67.5%) and purified by means of column chromatography. In this purifying operation, the crude material was supplied to a column having a diameter of 65 mm and filled with 200 g of silica gel, available under the trademark Wakogel C-200 made by Wako Pure Chemical Industries, Ltd., and was purified by a developing solvent consisting of a mixture of ethyl acetate and benzene each having the same volume. The purified product was obtained in an amount of 7.8 g.

The resultant product exhibited the following properties.

Melting point: 88° C. to 89° C.

Element analysis (as $C_{13}H_{16}N_2O_2$):

| | C | H | N |
|---|---|---|---|
| Measured (%) | 59.36 | 6.08 | 10.49 |
| Calculated (%) | 59.08 | 6.10 | 10.60 |

The product was subjected to infrared spectrophotometry and to H-NMR spectra analysis and was confirmed to be 3,5-diaminobenzoic acid ethyleneglycol monomethacrylate ester.

EXAMPLE 2

Preparation of 3,5-diaminobenzyl acrylate

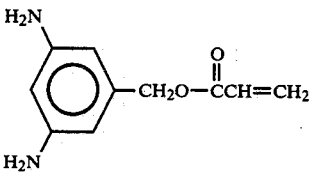

First Step (Conversion of 3,5-dinitrobenzyl alcohol to corresponding acryloyl compound)

A solution of 40 g of 3,5-dinitrobenzyl alcohol dissolved in 400 ml of THF was added with 40.4 g of triethylamine. A solution of 20 g of acrylic acid chloride dissolved in 200 ml of THF was added dropwise to the above-mentioned 3,5-dinitrobenzyl alcohol solution at a temperature of from 3° C. to 4° C. over a period of 40 minutes while the resultant mixture was stirred. After the dropwise addition, the resultant reaction mixture was stirred for one hour.

The reaction mixture was filtered by means of a Buchner funnel, the resultant filtrate was placed in an evaporator under a reduced pressure to eliminate THF therefrom, and the resultant concentrated filtrate was poured to 2.5 l of water so as to allow the reaction product to precipitate. The precipitated reaction product was isolated by means of filtration. A crude dinitro compound was obtained in an amount of 46 g.

The crude dinitro compound was purified by means of column chromatography in the same manner as that described in Synthesis Example 1. The purified product was 42.8 g (corresponding to a yield of 84%) of 3,5-dinitrobenzyl acrylate in the form of light yellowish white crystals.

Second Step (Reduction of 3,5-dinitrobenzyl acrylate)

A solution of 20 g of 3,5-dinitrobenzyl acrylate prepared in the first step in 140 g of acetic acid was added intermittently by small amounts to a suspension of 140 g of iron powder in a mixture of 70 g of acetic acid with 70 g of water at a temperature of from 20° C. to 25° C. while the resultant reaction mixture was stirred.

After the above-mentioned reaction operation, the resultant reaction mixture was filtered to remove the iron powder, the resultant filtrate was neutralized with an aqueous ammonia solution, and the reaction product was extracted by 2.3 l of ethyl acetate. The extract solution was dried by means of anhydrous sodium sulfate and then the ethyl acetate solution phase was concentrated to an amount of 20 to 40 ml. The concentrated extract solution was subjected to the same column chromatography purifying procedure as that described in Synthesis Example 1, except that the column had a diameter of 50 mm and the developing solvent consisted of a mixture of 3 parts by volume of benzene with 2 parts by volume of ethyl acetate.

The purified product was in an amount of 10.5 g, corresponding to a yield of 68.9%, and in the form of white crystals. The results of element analysis of the purified product were as follows.

Element analysis (as $C_{10}H_{12}N_2O_2$):

|  | C | H | N |
| --- | --- | --- | --- |
| Measured (%) | 62.24 | 6.46 | 14.58 |
| Calculated (%) | 62.49 | 6.29 | 14.57 |

As a result of infrared spectrophotometry and H-NMR spectra analysis, it was confirmed that the resultant product consisted of 3,5-diaminobenzyl acrylate.

SYNTHESIS EXAMPLE 3

Preparation of 4-acrylamido-3,4'-diaminodiphenylether

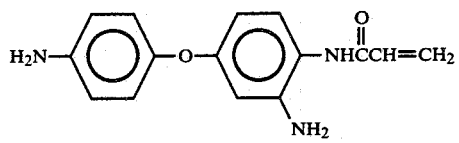

First Step (Hydrolysis of 4-acetylamido-3,4'-dinitrodiphenylether)

A Claisen alkali solution, prepared by dissolving 105 g of potassium hydroxide in 75 ml of water and by diluting the aqueous solution with methyl alcohol to a volume of 300 ml, was added in an amount of 300 ml to 60 g (0.19 mole) of 4-acetylamido-3,4'-dinitrodiphenyl ether. The resultant hydrolysis solution was heated at a temperature of 70° C. for 10 minutes and then was mixed with 1000 ml of water so as to allow the hydrolysis product to precipitate in the form of reddish orange crystals.

The precipitated crystals were collected and dried under reduced pressure.

The resultant 4-amino-3,4'-dinitrodiphenylether was obtained in an amount of 51.2 g, which corresponded to a yield of 98%.

Second Step (conversion of 4-amino-3,4'-dinitrodiphenylether to a corresponding acrylamido compound)

A solution of 66 g (0.72 mole) of acrylic acid chloride in 200 ml of THF was added dropwise to a solution of 50 g (0.18 mole) of 4-amino-3,4'-dinitrodiphenylether dissolved in a mixture of 800 ml of THF with 86 g (1.08 ml) of pyridine at room temperature over a period of 90 minutes, while allowing the temperature of the resultant reaction mixture to rise from 24° C. to 35° C. The reaction mixture was heated at a temperature of from 40° C. to 45° C. for one hour and then was cooled to room temperature. The reaction mixture was filtered, and the filtrate was concentrated to a volume of about 50 ml and then poured to 3 l of a 5% ammonia aqueous solution containing pieces of ice so as to allow the reaction product to precipitate in the form of crystals. The crystals were collected and dried at room temperature under reduced pressure. The dried product was purified by the same column chromatography as that described in Synthesis Example 1, except that the developing solvent consisted of benzene alone.

The purified product was 32.6 g (corresponding to a yield of 55%) of 4-acrylamido-3,4'-dinitrodiphenylether in the form of yellow crystals.

Third Step (Reduction of 4-acrylamido-3,4'-dinitrodiphenylether)

A solution of 16 g (0.05 mole) of the 4-acrylamido-3,4-dinitrodiphenylether obtained in the above-mentioned second step and dissolved in 60 g of acetic acid was added intermittently by small amounts to a suspension of 27 g of iron powder in a mixture of 15 g of water with 15 g of acetic acid, while the resultant reaction mixture was stirred. Since the reaction in the reaction mixture was exothermic, the reaction mixture was cooled to a temperature of about 50° C. and was maintained at this temperature throughout the reaction.

After the reaction was completed, the reaction mixture was poured to 200 ml of ice water made alkaline by a 25% ammonia aqueous solution. The resultant alkaline solution was diluted by 600 ml of water. The reaction product in the diluted solution was extracted by a solvent consisting of 3 parts by volume of ethyl ether with one part by volume of ethyl acetate. The extract solution was dried by means of anhydrous sodium sulfate, and then the solvent was eliminated.

The reaction product was isolated in an amount of 8 g in a yield of 60%. The reaction product exhibited the melting point and element analysis results as shown below.

Melting point: 105° C. to 106° C.
Element analysis (as $C_{15}H_{15}N_3O_2$):

|  | C | H | N |
| --- | --- | --- | --- |
| Measured (%) | 66.46 | 5.71 | 15.60 |
| Calculated (%) | 66.90 | 5.61 | 15.60 |

Also, it was confirmed by means of infrared spectrophotometry and H-NMR spectra analysis that the resultant reaction product was 4-acrylamido-3,4'-diaminodiphenylether.

SYNTHESIS EXAMPLE 4

Preparation of 4'-N,N-dimethylamino-3,5-diamino benzophenone

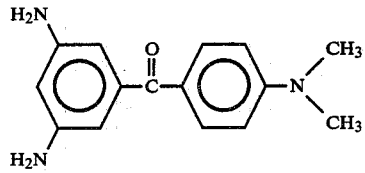

First Step (synthesis of 3,5-dinitrobenzanilide)

To 71 g of aniline was added 22.3 g of powdery 3,5-dinitrobenzoyl chloride with stirring. Generation of heat was observed until the temperature reached 50° C. A yellowish orange paste was obtained. The paste was stirred for 10 minutes and, then, when the liquid reaction mixture was poured into 1 l of water and the mixture was rendered acidic by concentrated hydrochloric acid (35%), a white precipitate was formed. The precipitate was recovered by filtration and dried to obtain 23.58 g of 3,5-dinitrobenzanilide (the yield was 84.6%).

Second Step (synthesis of 4'-N,N-dimethylamino-3,5-dinitrobenzophenone)

To 23 g of 3,5-dinitrobenzanilide were added 66.3 g of N,N- dimethylaniline and 33.8 g of phosphorus oxychloride, and reaction was carried out at a temperature of 120 to 130° C. for 4 hours to obtain a blackish green, highly viscous liquid reaction product. When this reaction product was added to 1.5 l of an aqueous solution containing 200 ml of concentrated hydrochloric acid, generation of heat was observed and the initial tar-like mixture was converted with stirring to a green powder suspension. The suspension was stirred at 40° C. to 50° C. for 1 hour and was allowed to stand still overnight, followed by filtration. The recovered agglomerate was poured into 200 ml of a 5% aqueous solution of hydrochloric acid and washed at 50° C. to 60° C. for 1 hour, followed by filtration. Then, the agglomerate was added to 150 ml of concentrated hydrochloric acid and dissolved therein at 40° C. to 50° C., and the insoluble solids were removed by filtration. The filtrate was cooled and an aqueous solution of 80 g of sodium hydroxide in 1.5 l of water was poured to the ice-cooled solution to obtain 11.4 g of a yellowish green precipitate (the yield was 45.8%).

The precipitate was purified by column chromatography. Namely, a chromatographic tube having an inner diameter of 50 mm and a capacity of 500 ml was packed with 200 g of Wakogel C-200, and separation was conducted by using benzene as a developing solvent to obtain 9.5 g of 4'-N,N-dimethylamino-3,5-dinitrobenzophenone in the form of a yellowish orange needle crystal.

Third Step (reduction of 4'-N,N-dimethylamino-3,5-dinitrobenzophenone)

To a solution comprising 43.9 g of stannous chloride, 120 ml of concentrated hydrochloric acid, and 36 ml of acetic acid was added 9.5 g of 4'-N,N-dimethylamino-3,5-dinitrobenzophenone obtained at the second step in the powdery form at room temperature with stirring over a period of 30 to 40 minutes to effect reaction.

Then, the reaction was further conducted at 90° C. for 3 hours. The temperature was lowered to room temperature, and the liquid reaction mixture was poured into 1.5 l of an aqueous solution containing 200 ml of 23% aqueous ammonia, which was ice-cooled, to form a white suspension. The white suspension was extracted with ethyl acetate, and the ethyl acetate layer was dried with anhydrous sodium sulfate and ethyl acetate was removed by an evaporator to obtain 7.3 g of the intended product in the form of a light yellow scaly crystal (the reduction yield was 94.4%).

Melting point: 164°–165° C.

Elementary analysis (as $C_{15}H_{17}N_3O$):

|  | C | H | N |
|---|---|---|---|
| Measured (%) | 70.90 | 6.72 | 16.58 |
| Calculated (%) | 70.56 | 6.71 | 16.46 |

From the results of infrared absorption spectrum and N-NMR spectrum, it was confirmed that the obtained product was 4'-N,N-dimethylamino-3,5-diaminobenzophenone.

EXAMPLE 1

(Polyamide resin produced from terephthalic acid dichloride and 3,5-diaminobenzoic acid ethyleneglycol monomethacrylate ester)

A three-necked flask was filled with dried nitrogen gas and was then charged with a solution of 0.05 g of lithium chloride and 0.5386 g of 3,5-diaminobenzoic acid ethyleneglycol monomethacrylate ester dissolved in 4.0 ml of N-methyl-2-pyrrolidone (NMP). The solution was added with 0.406 g of terephthalic acid dichloride at a temperature of 0° C. while the resultant mixture is stirred. The resultant reaction mixture was stirred at the above-mentioned temperature for 0.5 hours and then at temperature of 50° C. for 3 hours.

The resultant reaction mixture was diluted with 15 ml of NMP and the diluted mixture was admixed with a mixture of 100 ml of methyl alcohol with 100 ml of water to precipitate the resultant polyamide resin. The precipitate was collected by means of filtration and was dried. The collected polyamide was in the form of white powder and in an amount of 0.78 g.

EXAMPLES 2 TO 5

In each of Examples 2 to 5, the same procedures as those described in Example 1 were carried out except that the aromatic dicarboxylic acid component and the aromatic diamine component used were as indicated in Table 1.

TABLE 1

| Example No. | Aromatic dicarboxylic acid component | Aromatic diamine component |
|---|---|---|
| 2 | Terephthalic acid dichloride | 3,5-diaminobenzyl acrylate |
| 3 | Terephthalic acid dichloride | 3'-methyl-3,5-diaminochalcone |
| 4 | Isophthalic acid dichloride | 4-acrylamido-3,4'-diaminodiphenyl-ether |
| 5 | Terephthalic acid dichloride | Mixture of 80 molar % of 3,5-diaminobenzoic acid ethyleneglycol monomethacrylate ester and 20 molar % of p-phenylenediamine |

EXAMPLE 6

Polyamide resin was produced from terephthaloyl dichloride, 3,5-diaminobenzoic acid ethyl methacrylate ester, and 4'-N,N-dimethylamino-3,5-diaminobenzophenone.

A three-necked flask was filled with dry nitrogen gas and was then charged with 0.25 g of lithium chloride, 4.757 g of 3,5-diaminobenzoic acid ethyl methacrylate ester, and 0.51 g of 4'-N,N-dimethylamino-3,5-diaminobenzophenone. Then, 40 ml of N-methyl-2-pyrrolidone (NMP) was added to the charge of the flask and the charge was dissolved. Then, 4.061 g of terephthaloyl dichloride was added at 0° C. with stirring. Reaction was carried out in this state for 0.5 hour and then at room temperature for 0.5 hour.

After the reaction, 75 ml of NMP was added, and the liquid reaction mixture was added to a liquid mixture comprising 1 l of methanol and 1 l of water to precipitate a polyamide. The precipitate was recovered by filtration and dried to obtain 8.36 g of a white powdery polyamide.

EXAMPLES 7 AND 8

Polyamides were prepared in the same manner as described in Example 6 except that diamine components shown in Table 2 were used instead of the 3,5-diaminobenzoic acid ethyl methacrylate ester and 4'-N,N-dimethylamino-3,5-diaminobenzophenone used in Example 6.

TABLE 2

| | Diamine Components |
|---|---|
| Example 7 | 3,5-diaminobenzoic acid ethyl methacrylate ester (90 mole %) and 9,9-bis(4-aminophenyl)-10-anthrone (10 mole %) |
| Example 8 | 3,5-diaminobenzyl acrylate (90 mole %) and 4'-N,N—dimethyl-amino-3,5-diaminobenzophenone (10 mole %) |

Physical properties of the polyamide resins prepared in Examples 1 through 8

Each of the polyamide resins prepared in Examples 1 through 8 were subjected to the following measurements.

(1) Viscosity

A logarithmic viscosity of the polyamide resin was determined in a solution of 0.5 g of the polyamide resin dissolved in 100 ml of NMP at a temperature of 30° C.

(2) Film-forming property

A film having a thickness of 10 microns was formed on a glass plate by the polyamide resin.

The film on the glass plate was immersed in water and was peeled off from the glass plate. The peeled film was folded at an angle of 180 degrees. The degree of film-forming property was classified as follows.

Excellent: No crack was found in the peeled film.
Ordinary: No crack was formed in the film-forming step whereas cracks were formed in the folding step.
Poor: Cracks were formed in the film-forming step.

(3) Solubility of polyamide resin in NMP

The amount (% by weight) of the polyamide resin dissolved in NMP at room temperature was measured.

(4) Thermodecomposition-initiating temperature

The thermodecomposition-initiating temperature of a polyamide resin was represented by a weight decrease-initiating temperature of the polyamide resin measured by a differential thermobalance (Trademark TG-DSC, Rigaku Denki Co.)

(5) Photosetting properties

A solution of 10% by weight of a polyamide resin and 6 phr of Michler's ketone in NMP was spread on a glass plate by using a rotary coating machine at a speed of 2000 to 5000 rpm. The polyamide resin solution layer was dried at a temperature of 50° C. under a reduced pressure of 1 to 2 mmHg for 5 hours. The resultant polyamide resin film had a thickness of several microns and was subjected to the following tests.

(a) Photosensitivity test

The polyamide resin film was photo-set by exposing it to a superhigh pressure mercury lamp at an illuminance of 7.2 mW/cm² at a wavelength of 350 mμ. A necessary quantity (J/cm²) fo actinic rays irradiated for completing the photo-setting of the polyamide resin film was measured.

(b) Resolving power test

The polyamide resin film was relief-patterned by using a negative photomask test chart having a minimum line thickness of 0.98±0.25 micron (under a trademark of Toppan Test Chart N, Toppan Printing Co., Ltd.). The quantity of the resultant relief pattern was evaluated.

The results of the above-mentioned measurements and tests are shown in Table 3.

TABLE 3

| | | | Example | | | | | | | |
|---|---|---|---|---|---|---|---|---|---|---|
| | | | 1 | 2 | 3 | 4 | 5 | 6 | 7 | 8 |
| Logarithmic viscosity (30° C.) | | | 0.48 | 0.40 | 0.41 | 0.34 | 0.50 | 1.13 | 1.26 | 1.08 |
| Film-forming property | | | Excellent | Excellent | Excellent | Excellent | Excellent | Excellent | Excellent | Excellent |
| Solubility in NMP (wt %) | | | >20 | >20 | >20 | >20 | >20 | >20 | >20 | >20 |
| Thermodecomposition-initiating temperature (°C.) | | | 307 | 310 | 305 | 282 | 315 | 312 | 308 | 316 |
| Photo-setting property | Photo-sensitivity | Thickness of film (μ) | 6.7 | 7.5 | 8.0 | 4.7 | 8.2 | 45 | 53 | 42 |
| | | Quantity of irradiated actinic rays (J/cm²) | 0.042 | 0.08 | 0.17 | 4.0 | 0.084 | 0.13 | 0.25 | 0.19 |
| | Resolving power | | Good | Good | Good | Good | Good | Good | Good | Good |

We claim:

1. An organic solvent-soluble photosensitive polyamide resin comprising a polycondensation product of an aromatic dicarboxylic acid component consisting of at least one member selected from the group consisting of aromatic carboxylic acids and acid halides thereof with an aromatic diamine component consisting of 10 to 100 molar % of at least one member selected from the group consisting of diamino chalcone compounds and aromatic diamine compounds of the formula

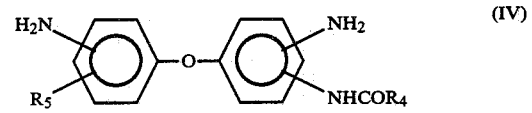

and

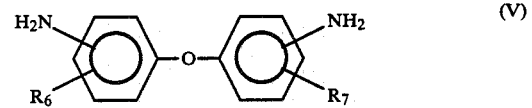

wherein X represents a divalent radical selected from the group consisting of —CO—O— and —CH₂—O—; R₃ represents a radical selected from the group consisting of

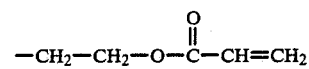

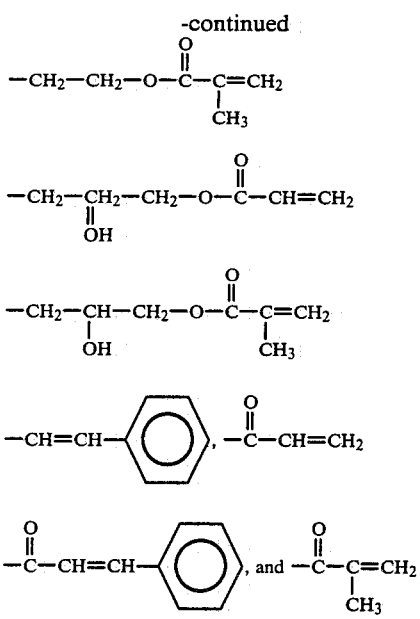

$R_4$ represents a member selected from the group consisting of —CH=CH$_2$ and

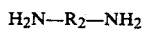

$R_5$ represents a member selected from the group consisting of hydrogen and —NH—CO—R$_4$; $R_6$ represents a member selected from the group consisting of hydrogen and alkyl having from 1 to 5 carbon atoms; and $R_7$ represents a member selected from the group consisting of CH$_2$=CH—COOCH$_2$CH$_2$OOC— and CH$_2$=C(CH$_3$)—COOCH$_2$CH$_2$OOC—; and 0 to 90 molar % of at least one aromatic diamine compound of the formula (II):

$$H_2N—R_2—NH_2 \qquad (II)$$

in which formula (II) R$_2$ represents a nonphoto cross-linkable aromatic divalent residue.

2. The photosensitive polyamide resin as claimed in claim 1, wherein said aromatic dicarboxylic acid is selected from the group consisting of terephthalic acid, isophthalic acid, 4,4'-dicarboxy-biphenyl, 4,4'-dicarboxydiphenylmethane, and 4,4'-dicarboxy-biphenylether.

3. The photosensitive polyamide resin as claimed in claim 1, wherein said aromatic diamine compound of the formula (III) is selected from the group consisting of 3,5-diaminobenzoic acid ethyleneglycol monoacrylate ester, 3,5-diaminobenzoic acid ethyleneglycol monomethacrylate ester, 3,5-diaminobenzoic acid glycidyl acrylate ester, 3,5-diaminobenzoic acid glycidyl methacrylate ester, 3,5-diaminobenzoic acid cinnamic acid ester, 2,4-diaminobenzoic acid ethyleneglycol monoacrylate ester, 2,4-diaminobenzoic acid ethyleneglycol monomethacrylate ester, 2,4-diaminobenzoic acid glycidyl acrylate ester, 2,4-diaminobenzoic acid glycidyl methacrylate ester, 2,4-diaminobenzoic acid cinnamic acid ester 3,5-diaminobenzyl acrylate, and 3,5-diaminobenzyl methacrylate.

4. The photosensitive polyamide resin as claimed in claim 1, wherein the aromatic diamine compound of the formula (IV) is selected from the group consisting of 4-acrylamido-3,4'-diaminodiphenylether, 2-acrylamido-3,4'-diaminodiphenylether, 4-cinnamamido-3,4'-diaminodiphenylether, 3,4'-diacrylamido-3',4-diaminodiphenylether, and 3,4'-dicinnamamido-3',4-diaminodiphenylether.

5. The photosensitive polyamide resin as claimed in claim 1, wherein the aromatic diamine compound of the formula (V) is selected from the group consisting of 4-methyl-2'-carboxyethyl methacrylate-3,4'-diaminodiphenylether and 4-methyl-2'-carboxyethylacrylate-3,4'-diaminodiphenylether.

6. The photosensitive polyamide resin as claimed in claim 1, wherein the diaminochalcone compound is selected from the group consisting of 4,4'-diaminochalcone, 3,3'-diaminochalcone, 3,4'-diaminochalcone, 3',4-diaminochalcone, 4'-methyl-3',4-diaminochalcone, 4'-methoxy-3',4-diaminochalcone and 3'-methyl-3,5-diaminochalcone.

7. The photosensitive polyamide resin as claimed in claim 1, wherein said aromatic diamine compound of the formula (II) is selected from the group consisting of p-phenylenediamine, m-phenylenediamine, 2,4-diaminotoluene, 4,4'-diaminodiphenylether, 4,4'-diaminodiphenylmethane, o-toluidine, 1,4-bis(4-aminophenoxy)benzene, 2,2-bis(4-aminophenoxyphenyl)propane and o-toluidinesulfone.

8. The photosensitive polyamide resin as claimed in claim 1, wherein the aromatic divalent residue R$_2$ in said aromatic diamine compound of the formula (II) is selected from the group consisting of residues of the formula:

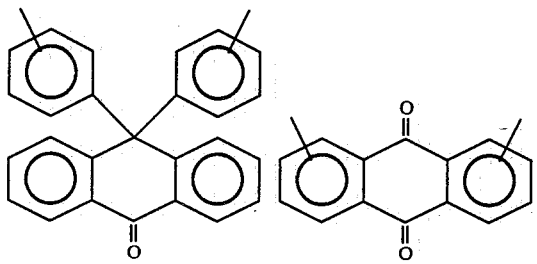

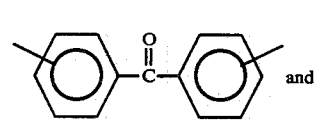

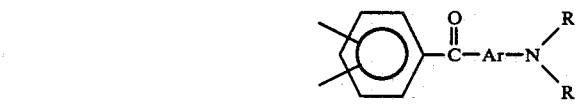

wherein Ar represents an aromatic ring and R represents a methyl or ethyl group.

9. The photosensitive polyamide resin as claimed in claim 8, wherein the amount of said aromatic diamine compound of the formula (II) is not more than 40 molar % based on the total amount of the aromatic diamine component.

10. The photosensitive polyamide resin as claimed in claim 8, wherein said aromatic diamine compound of the formula (II) is selected from the group consisting of 9,9-bis(4-aminophenyl)-10-anthrone, 1,5-diaminoanthaquinone, 1,4-diaminoanthraquinone, 3,3'-diaminobenzophenone, 4'-N,N-dimethylamino,3,5-diaminobenzophenone, and 1-dimethylamino-4-(3,5-diaminobenzoyl)naphthalene.

* * * * *